United States Patent
Matsubara et al.

(10) Patent No.: US 11,721,372 B2
(45) Date of Patent: Aug. 8, 2023

(54) SYSTEM AND METHOD FOR READING AND WRITING MEMORY MANAGEMENT DATA THROUGH A NON-VOLATILE CELL BASED REGISTER

(71) Applicant: Micron Technology, Inc., Boise, ID (US)

(72) Inventors: Yasushi Matsubara, Isehara (JP); Yusuke Jono, Musashimurayama (JP); Donald Martin Morgan, Meridian, ID (US); Nobuo Yamamoto, Nerima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/895,565

(22) Filed: Aug. 25, 2022

(65) Prior Publication Data
US 2023/0068011 A1    Mar. 2, 2023

Related U.S. Application Data

(63) Continuation of application No. 16/916,612, filed on Jun. 30, 2020, now Pat. No. 11,462,249.

(51) Int. Cl.
*G11C 7/20* (2006.01)
*G11C 11/22* (2006.01)
(Continued)

(52) U.S. Cl.
CPC ............ *G11C 7/065* (2013.01); *G11C 7/1027* (2013.01); *G11C 7/1039* (2013.01); *G11C 7/18* (2013.01); *G11C 7/20* (2013.01)

(58) Field of Classification Search
CPC ...... G11C 7/065; G11C 7/1027; G11C 7/1039; G11C 7/18; G11C 7/20; G11C 11/2293;
(Continued)

(56) References Cited

U.S. PATENT DOCUMENTS 10,446,214 B1    10/2019  Di et al.
11,074,956 B1     7/2021  Vo et al.
(Continued)

FOREIGN PATENT DOCUMENTS

TW       I267862 B     12/2006
TW       200731079 A    8/2007
TW       M441187 U     11/2012

OTHER PUBLICATIONS

International Search Report and Written Opinion received for PCT Patent Application No. PCT/US21/38507, dated Oct. 12, 2021, 10 pages.

(Continued)

*Primary Examiner* — Jay W. Radke
(74) *Attorney, Agent, or Firm* — Holland & Hart LLP

(57) ABSTRACT

Methods, systems, and devices for system and method for reading and writing memory management data through a non-volatile cell based register are described. A memory device may include a set of latch units addressable via a set of row lines and a set of column lines. Each latch unit may include a sense amplifier coupled with a first line and a first non-volatile capacitor coupled with the first line and a second line, where the first capacitor is configured to store a charge representing one or more bits. Additionally, each latch unit may include a second capacitor coupled with the first line and a third line, where the second capacitor is configured to amplify a voltage at the first line based on the charge stored in the first capacitor.

20 Claims, 12 Drawing Sheets

(51) Int. Cl.
  *G11C 7/06*   (2006.01)
  *G11C 7/10*   (2006.01)
  *G11C 7/18*   (2006.01)

(58) Field of Classification Search
  CPC . G11C 11/565; G11C 11/221; G11C 11/2273;
   G11C 11/2275; G11C 2207/2281; G11C
   2207/229
  See application file for complete search history.

(56) References Cited

U.S. PATENT DOCUMENTS

| | | |
|---|---|---|
| 11,462,249 B2* | 10/2022 | Matsubara .......... G11C 11/2273 |
| 2005/0057957 A1 | 3/2005 | Masui |
| 2005/0180222 A1 | 8/2005 | Suzuki |
| 2007/0121377 A1 | 5/2007 | Kajiyama |
| 2011/0148463 A1 | 6/2011 | Kato et al. |
| 2011/0187410 A1 | 8/2011 | Kato et al. |
| 2015/0155482 A1 | 6/2015 | Lee |
| 2019/0042634 A1 | 2/2019 | Stolte et al. |
| 2019/0157292 A1 | 5/2019 | Kim et al. |
| 2019/0293424 A1 | 9/2019 | Haneda |
| 2020/0051606 A1 | 2/2020 | Di Vincenzo et al. |

OTHER PUBLICATIONS

Taiwan Patent Office, "Office Action," issued in connection with Taiwan Patent Application No. 110120543 dated Mar. 24, 2022 (5 pages).

* cited by examiner

SYSTEM AND METHOD FOR READING AND WRITING MEMORY MANAGEMENT DATA THROUGH A NON-VOLATILE CELL BASED REGISTER

CROSS REFERENCE

The present application for patent is a continuation of U.S. patent application Ser. No. 16/916,612 by Matsubara et al., entitled "SYSTEM AND METHOD FOR READING AND WRITING MEMORY MANAGEMENT DATA THROUGH A NON-VOLATILE CELL BASED REGISTER," filed Jun. 30, 2020, assigned to the assignee hereof, and is expressly incorporated by reference in its entirety herein.

BACKGROUND

The following relates generally to one or more systems for memory and more specifically to systems and methods for reading and writing memory management data through a non-volatile cell based register.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Some memory device structures on a non-volatile memory chip may be unsuitable for storage of configuration data. For example, in cases where a memory bank of a memory array of the memory device configures the memory device structures, the memory device may not have access to one or more bank signals used to perform the configuring. In addition, the robustness of storing data in the memory structure may not be sufficient for non-volatile storage of configuration data, and data integrity may rely upon external controllers and error correction. In addition, writing updated data at power-down or reading data at power-up may be challenging with traditional structures, where some of the voltages or timing may depend on the configuration data.

The disclosed memory structure uses non-volatile memory cells in a robust self-contained latch unit for non-volatile storage of device configuration data on a memory chip. The array of latch units may be addressable by rows and columns, and each unit may include a non-volatile capacitor (generally made up of multiple memory cell structures), a sense amplifier, and an amplifier capacitor. Each latch unit may have multiple non-volatile capacitors, with at least one on each side of the sense amplifier. Writing may be performed via the sense amplifier to drive the capacitor voltages (e.g., with the other sides of the capacitors at a first plate voltage and a second plate voltages, respectively), and reading may be performed via the sense amplifier, or a separate read driver coupled with the sense amplifier.

Features of the disclosure are initially described in the context of systems and dies as described with reference to FIGS. 1-2. Features of the disclosure are described in the context of a latch unit array, a latch unit circuit, ferroelectric cell array configurations, a write sequence, a read sequence, a power-off sequence, and a power-on sequence as described with reference to FIGS. 3-9. These and other features of the disclosure are further illustrated by and described with reference to an apparatus diagram and flowcharts that relate to system and method for reading and writing memory management data through a non-volatile cell based register as described with reference to FIGS. 10-12.

Figure 1:
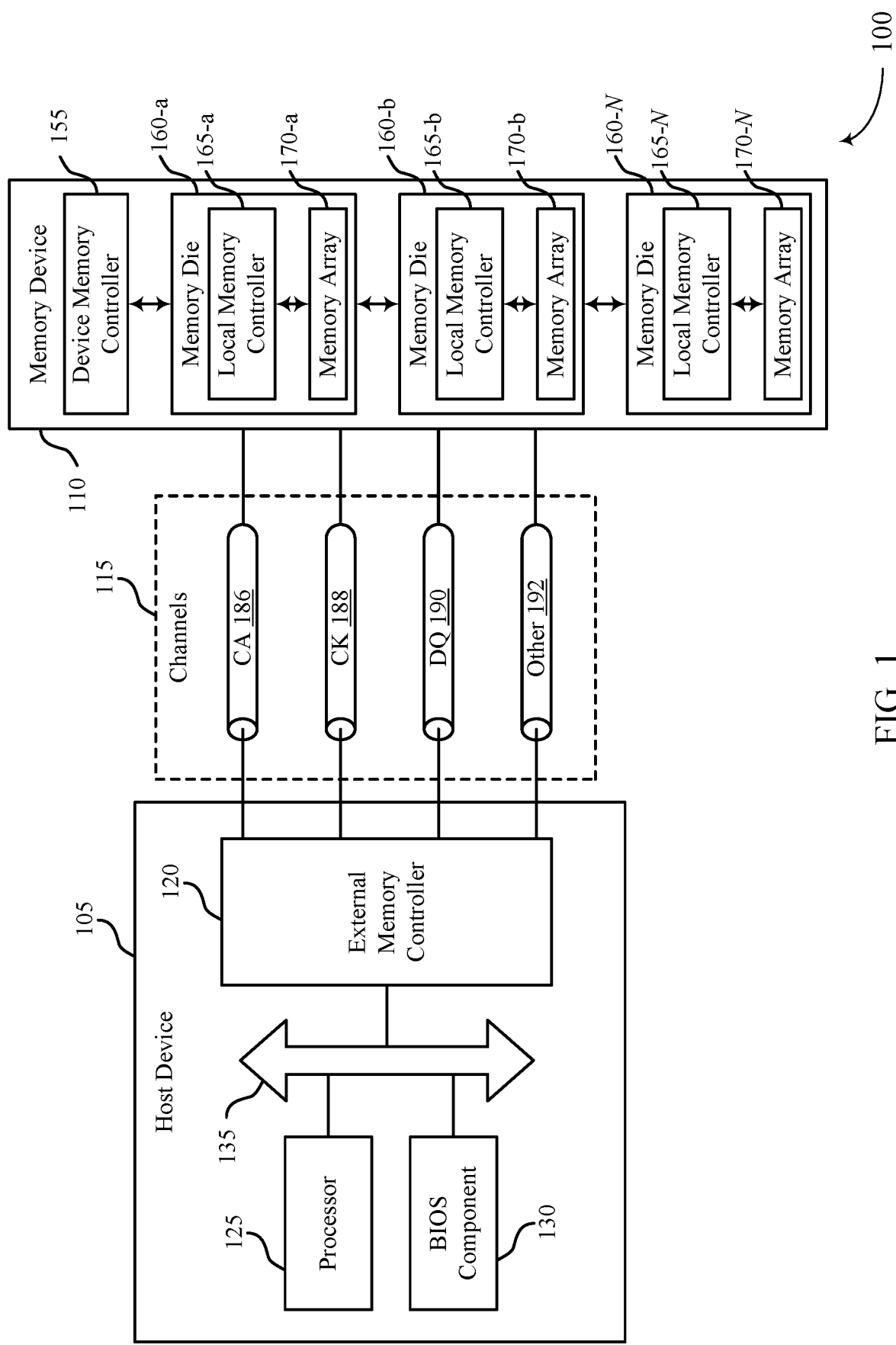
FIG. 1 illustrates an example of a system that supports systems and methods for reading and writing memory management data through a non-volatile cell based register in accordance with examples as disclosed herein.

FIG. 1 illustrates an example of a system 100 that supports systems and methods for reading and writing memory management data through a non-volatile cell based register in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may include a set of peripheral circuits, where the set of peripheral circuits may include a latch unit array. The latch unit array may include a set of latch units, where each latch unit is configured to store one or more bits. In some examples, the stored one or more bits may be one or more bits that the memory device 110 read from a memory array 170. In some examples, the memory device 110 may read one or more bits from the latch unit array and may store the one or more bits at a memory array 170. Additional details about the peripheral circuits may be described with reference to FIG. 2 and additional details about the structure of the latch unit array may be described with reference to FIG. 3.

Each latch unit array may include a sense amplifier, a non-volatile capacitor, and an amplifier capacitor. In some examples, the non-volatile capacitor may be referred to as a main capacitor and the amplifier capacitor may be referred to as a sub-capacitor. The non-volatile capacitor may be configured to store a charge representing one or more bits and the amplifier capacitor may be configured to amplify a voltage on a line based on the charge stored in the non-volatile capacitor. Additional details about the structure of a latch unit may be described with reference to FIG. 4. Each non-volatile capacitor and/or amplifier capacitor may include an array of ferroelectric cells. Additional details about the structure of the non-volatile capacitor and/or the amplifier capacitor may be described with reference to FIGS. 5A, 5B, and 5C.

Figure 2:
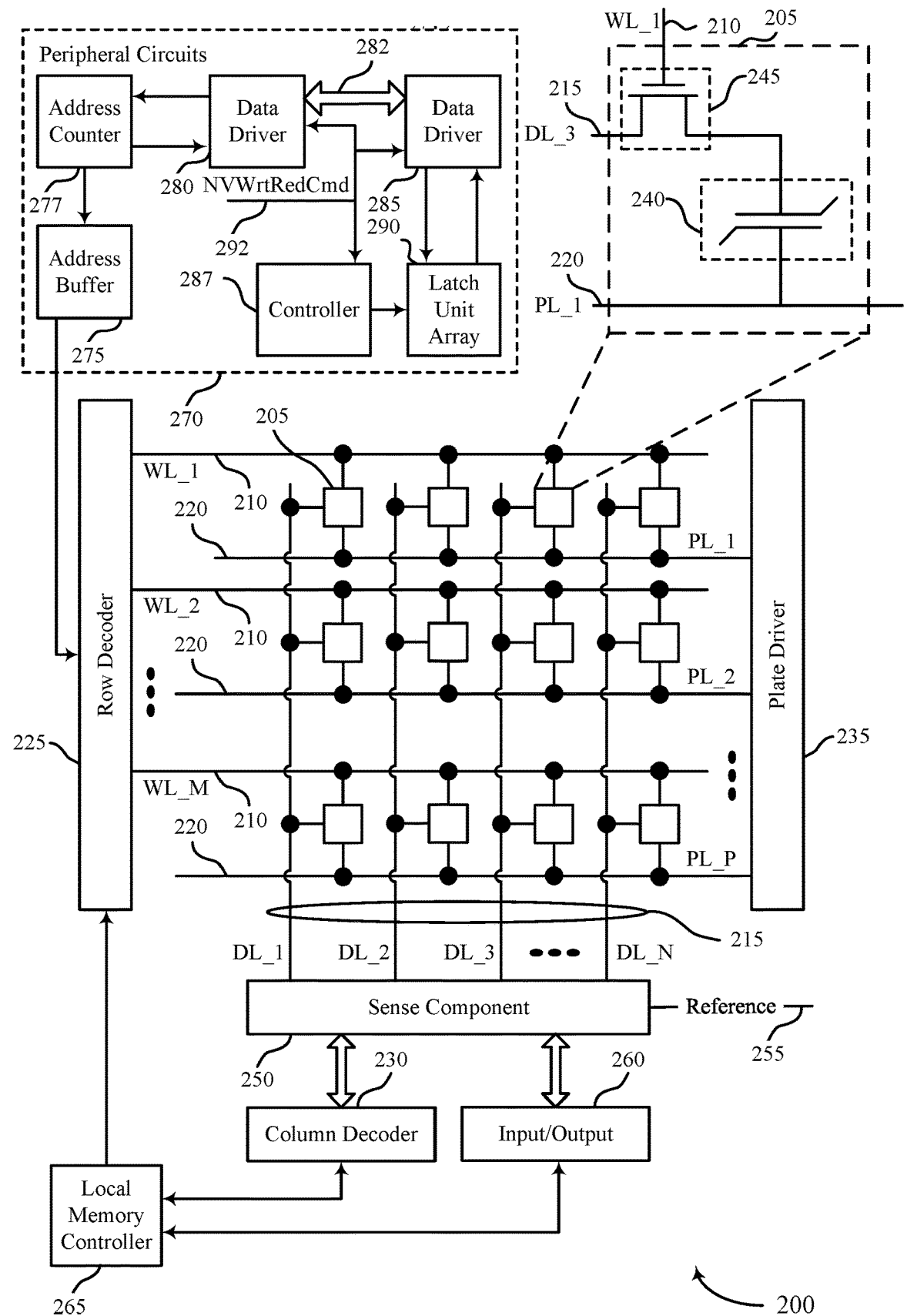
FIG. 2 illustrates an example of a memory die that supports systems and methods for reading and writing memory management data through a non-volatile cell based register in accordance with examples as disclosed herein.

FIG. 2 illustrates an example of a memory die 200 that supports systems and methods for reading and writing memory management data through a non-volatile cell based register in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, the memory die 200 may include peripheral circuits 270. Peripheral circuits 270 may include an address buffer 275, an address counter 277, a data driver 280, a data driver 285, a controller 287, and a latch unit array 290. Address buffer 275 may be coupled with row decoder 225 and address counter 277. Address counter 277 may be coupled with data driver 280. Data driver 280 may be coupled with data driver 285 (e.g., via I/O bus 282). Data driver 285 may be coupled with latch unit array 290. Latch unit array may be coupled with controller 287.

Address buffer 275 may be configured to provide information (e.g., row addresses) to the row decoder 225. Address counter 277 may be configured to increment an initial memory address one or more times and to provide the incremented memory addresses to address buffer 275. Address counter 277 may additionally provide information to data driver 280 (e.g., an address to access in the latch unit array 290 or an address to provide to the address buffer 275). Data driver 280 may communicate information with data driver 285 via I/O bus 282. Such information may include addresses or data.

Data driver 285 and controller 287 may be configured to access latch unit array 290. For instance, data driver 285 may be configured to activate one or more column lines (e.g., digit lines) of latch unit array 290 and controller 287 may be configured to provide, to a row driver of latch unit array 290, an address that indicates one or more row lines (e.g., word lines) for the row driver to activate. More details about the data driver 285 and the row driver may be described with reference to FIG. 3. Additionally, the latch unit array 290 may be configured to provide information (e.g., data read from the latch unit array 290) to data driver 285. In some examples, controller 287, data driver 285, and data driver 280 may be coupled with a control signaling line 292 that is configured to operate controller 287, data driver 285, and data driver 280. For instance, control signaling line 292 may provide control signaling to these components during a write process or read process as described herein.

In some examples, a write process may be performed on the latch unit array 290, in which the memory die 200 stores one or more bits values at the latch unit array 290. Performing the write procedure may involve the controller 287 activating a target row line of the latch unit array 290 and the data driver 390 activating one or more target column lines of latch unit array 290 (e.g., each column line of latch unit array 290). The one or more bit values stored at the latch unit array 290 may correspond to values stored at registers configured to control settings of the memory die 200. For instance, if local memory controller 265 includes one or more registers, the latch unit array 290 may be configured to store bit values for the one or more registers of the local memory controller 265. The write process may be performed on the latch unit array 290 as part of a power-down sequence (e.g., power-down sequence 800 as described with reference to FIG. 8), such that the current register values are stored in a non-volatile memory for re-loading at power-up. In some such cases, the memory die 200 may write to the latch unit array 290 in one block. Details about how an individual latch unit of the latch unit array 290 performs during the write process may be described with reference to FIG. 6.

In some examples, a read process may be performed on the latch unit array 290, in which the memory die 200 reads one or more bit values from the latch unit array 290. After the read is performed, the memory die 200 may transfer the read one or more bit values to one or more registers configured to control settings of the memory die 200. For instance, if local memory controller 265 includes one or more registers, the latch unit array 290 may be configured to read the one or more bit values to the one or more registers of the local memory controller 265. The latch unit array 290 may perform the read process as part of a power-up sequence (e.g., power-up sequence 900 as described with reference to FIG. 9). In some such cases, the memory die 200 may read from the latch unit array 290 in one block. Details about how an individual latch unit of the latch unit array 290 performs during the read process may be described with reference to FIG. 7.

In some examples, the one or more bits stored at and/or read from the latch unit array 290 may be used in selection of a row of a memory array of memory die 200. The memory die 200 may store the one or more bits at the latch unit array 290 (e.g., by performing a write process as described herein) when local memory controller 265 determines that a row of memory cells 205 is determined to be degraded below a threshold (e.g., when the row has been accessed above a threshold quantity of times). In such cases, the memory die 200 may retrieve the one or more bits (e.g., by performing a read process as described herein) and may store the one or more bits in a register of address buffer 275, which may be used by row decoder 225 to swap or otherwise avoid using the row Including data in the latch unit array 290 may have one or more advantages. For instance, the latch unit array 290 may act as a separate memory array for non-volatile storage of configuration data for memory device operation. The memory device including memory die 200 may not have primary control over the signaling that occurs in a bank of memory die 200. However, the memory device may be capable of controlling the signaling that occurs in latch unit array 290. Accordingly, the latch unit array 290 may be suitable for storing configuration data for memory device operation.

Figure 3:
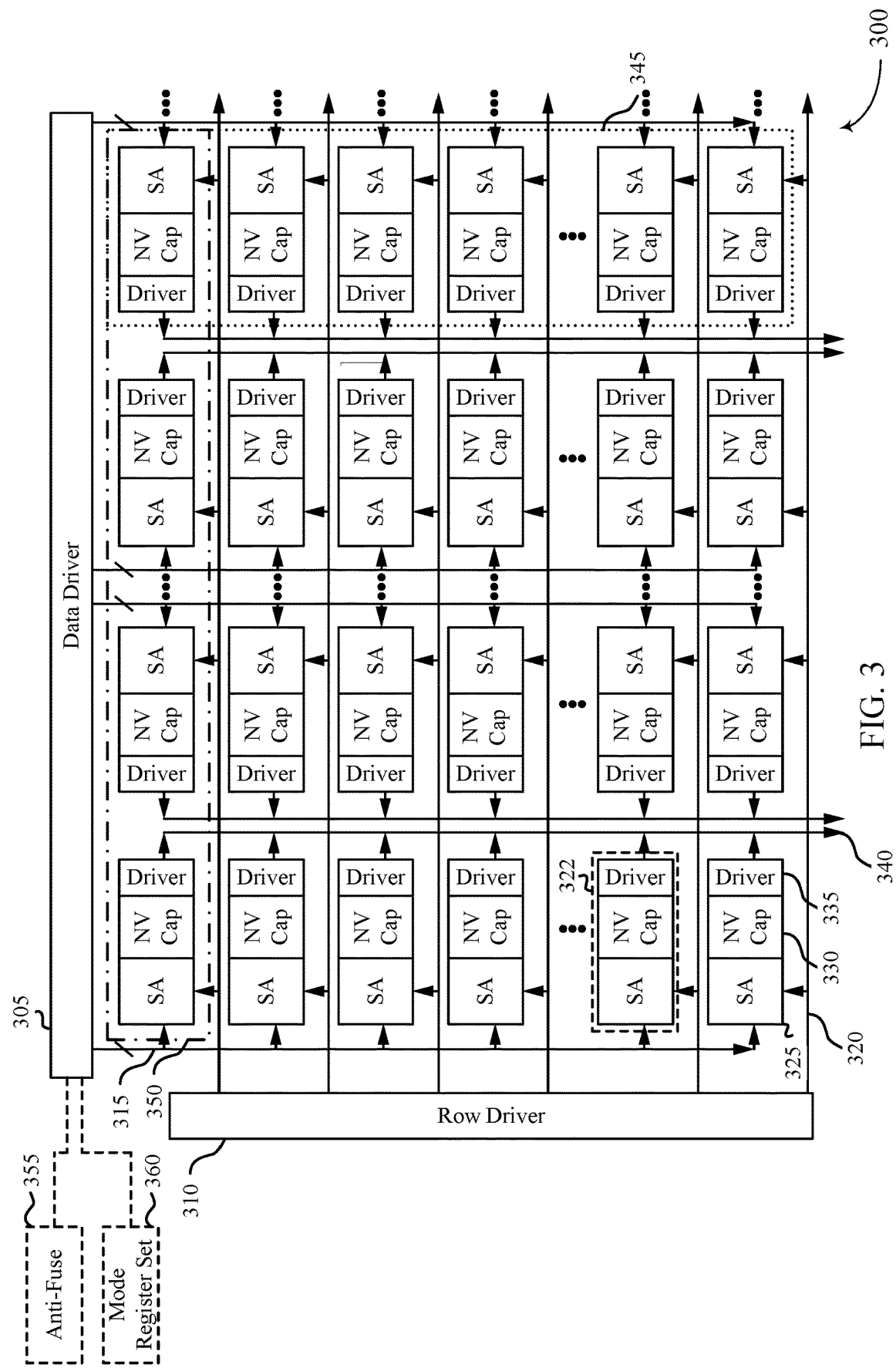
FIG. 3 illustrates an example of a latch unit array that supports systems and methods for reading and writing memory management data through a non-volatile cell based register in accordance with examples as disclosed herein.

FIG. 3 illustrates an example of a latch unit array 300 that supports systems and methods for reading and writing memory management data through a non-volatile cell based register in accordance with examples as disclosed herein. Latch unit array 300 may be an example of aspects of a latch unit array 290 as described with reference to FIG. 2.

Latch unit array 300 may include a data driver 305. Data driver 305 may be coupled with one or more column lines 315. Additionally, data driver 305 may be an example of a data driver 285 as described with reference to FIG. 2. Latch unit array 300 may also include a row driver 310. Row driver 310 may be coupled with one or more word lines 320. Additionally, row driver 310 may be coupled with a controller (e.g., a controller 287 as described with reference to FIG. 2).

Each column line 315 and word line 320 may be coupled with a respective latch unit 322, which may also be referred to as a latch cell. Each latch unit 322 may include a sense amplifier stage 325, a non-volatile capacitor stage 330, and an output driver stage 335. Each column line 315 and word line 320 may be coupled with a respective latch unit 322 (e.g., at the sense amplifier stage 325). The structure of a latch unit 322 may be described in further detail with reference to FIG. 4.

During a write operation, a latch unit 322 of the latch unit array 300 may be programmed to store a desired logic state. For instance, the row driver 310 may activate (e.g., apply a voltage to) a target word line 320 and the data driver 305 may activate (e.g., apply a voltage to) one or more target column lines 315 (e.g., each column line 315 of the latch unit array 300) to access one or more target latch units 322. The data driver 305 may apply a specific signal (e.g., write pulse) to the column line 315 during the write operation to store a specific state (e.g., charge) in the non-volatile capacitor stage 330 of the latch unit 322. The pulse used as part of the write operation may include one or more voltage levels over a duration.

During a read operation, the logic state stored in a non-volatile capacitor stage 330 of a latch unit 322 of the latch unit array 300 may be determined. For instance, a sense amplifier of the sense amplifier stage 325 of the latch unit 322 may be activated and may amplify one or more voltages output by the non-volatile capacitor stage 330. The output driver stage 335 may read an amplified voltage from the non-volatile capacitor stage 330 and may output the amplified voltage to output line 340. In some examples, portions of a read operation may be performed for each latch unit 322 of latch unit array 300 or of a row of latch unit array 300 at a same or overlapping time (e.g., sensing may occur concurrently, and then rows of latch unit array 300 read out sequentially).

In some examples, latch unit array 300 may include a set of redundant latch units 322 to be used for a redundancy repair method. For instance, a column 345 of latch units 322 may be set as redundant latch units 322. Additionally or alternatively, a row 350 of latch units 322 may be set as redundant latch units 322. If it is determined that a column or row of latch units 322 are faulty or otherwise insufficient for storing one or more bits (e.g., via a test process performed prior to operation of the device, or a self-test), the column 345 or row 350 may be swapped in for the insufficient column or row, respectively. In such examples, if one or more bits is to be stored at or retrieved from the insufficient column or row, the one or more bits may instead be stored or retrieved from the column 345 or the row 350. An anti-fuse 355 or a mode register set 360 may be configured to perform the swapping.

Figure 4:
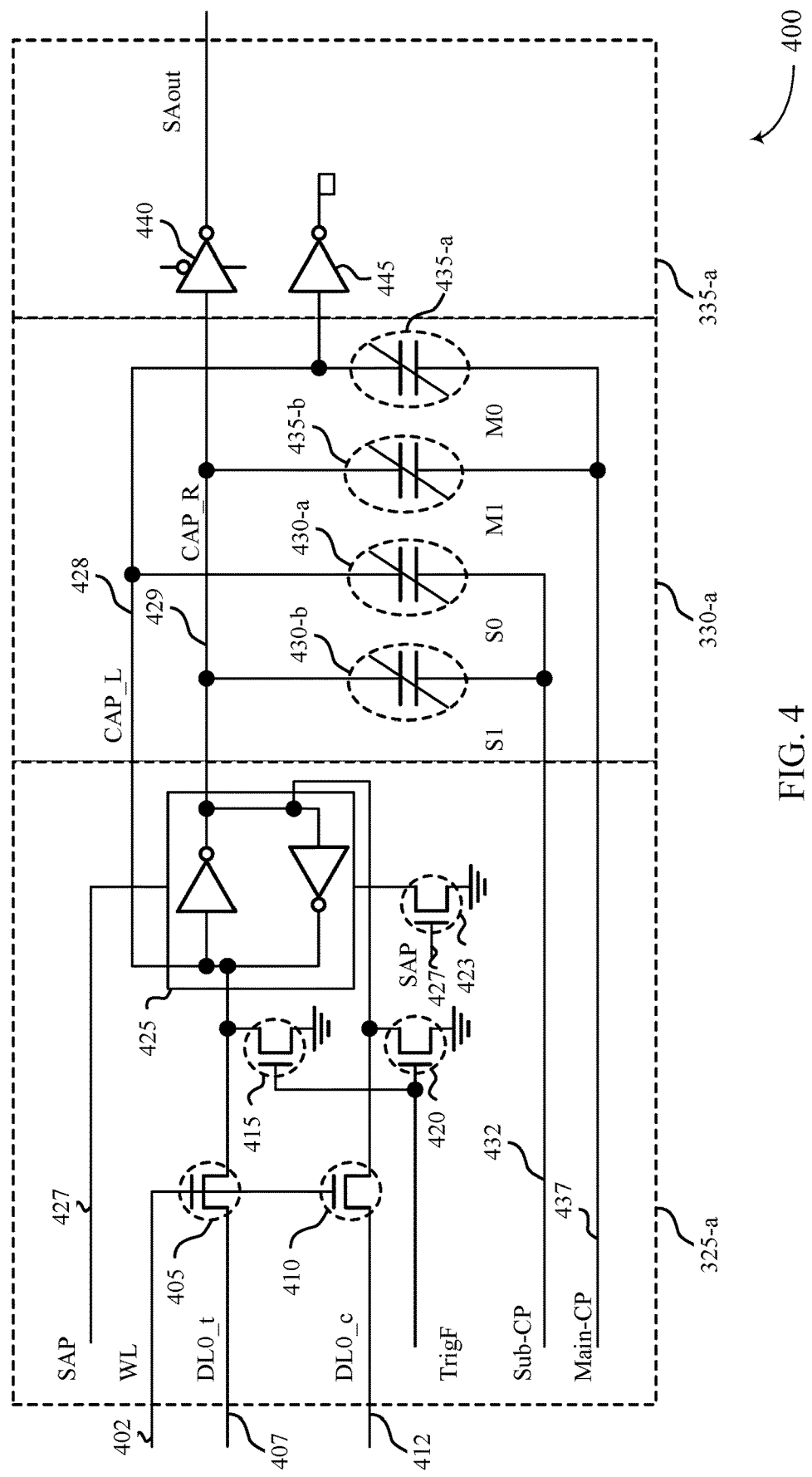
FIG. 4 illustrates an example of a latch unit circuit that supports systems and methods for reading and writing memory management data through a non-volatile cell based register in accordance with examples as disclosed herein.
Figure 5:
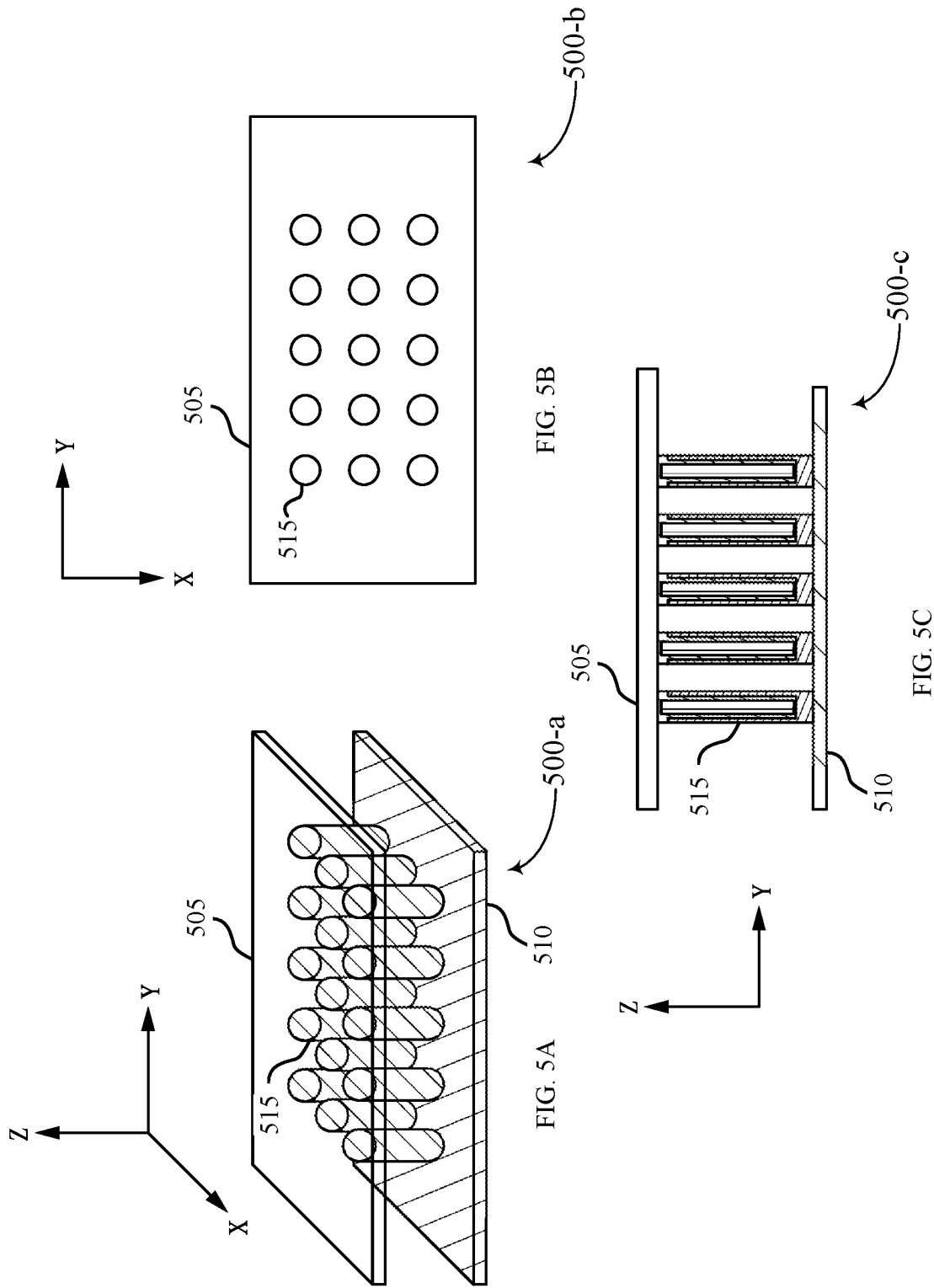
FIGS. 5A, 5B, and 5C illustrate examples of ferroelectric cell array configurations that support systems and methods for reading and writing memory management data through a non-volatile cell based register in accordance with examples as disclosed herein.

FIG. 4 illustrates an example of a latch unit circuit 400 that supports systems and methods for reading and writing memory management data through a non-volatile cell based register in accordance with examples as disclosed herein. Latch unit circuit 400 may be an example of aspects of a latch unit 322 as described with reference to FIG. 3. Latch unit circuit 400 may include sense amplifier stage 325-a, non-volatile capacitor stage 330-a, and output driver stage 335-a, which may be examples of sense amplifier stage 325, non-volatile capacitor stage 330, and output driver stage 335 as described with reference to FIG. 3.

Sense amplifier stage 325-a may include a word line 402, which may be an example of a word line 320 as described with reference to FIG. 3. Word line 402 may be coupled with a gate of transistor 405 and a gate of transistor 410. Accordingly, word line 402 may be configured to selectively activate or deactivate transistors 405 and 410. Additionally, sense amplifier stage 325-a may also include digit lines 407 and 412, which may be examples of column lines 315 as described with reference to FIG. 3. Digit line 407 may be coupled with a one of a source or drain of transistor 405 and digit line 412 may be coupled with one of a source or drain of transistor 410.

The other of the source or drain of transistor 405 may be coupled with one of a source or drain of transistor 415 and a first terminal of sense amplifier 425. The other of the source or drain of transistor 410 may be coupled with one of a source or drain of transistor 420 and a second terminal of sense amplifier 425. The other of the source or drain of transistors 415 and 420 may be coupled with an electrical ground. In some examples, transistors 415 and 420 may selectively couple an electrical ground with the sense amplifier 425 (e.g., according to trigger flag signaling). In some examples, the sense amplifier 425 may be coupled with a sense amplifier activation line 427 configured to activate or deactivate the sense amplifier 425. For example, sense amplifier activation line 427 may provide a supply voltage to virtual supply nodes in sense amplifier 425. Additionally, sense amplifier 425 may be coupled with a transistor 423 configured to selectively couple the sense amplifier 425 (e.g., virtual ground nodes within sense amplifier 425) with an electrical ground (e.g., according to a value of the voltage on the sense amplifier activation line 427).

The non-volatile capacitor stage 330-a may include a first capacitor line 428 and a second capacitor line 429. First capacitor line 428 may couple the sense amplifier 425 with a first sub-capacitor 430-a and a first main capacitor 435-a. Second capacitor line 429 may couple the sense amplifier 425 with a second sub-capacitor 430-b and a second main capacitor 435-b. First sub-capacitor 430-a and second sub-capacitor 430-b may be coupled with a sub-capacitor line 432. First main capacitor 435-a and second main capacitor 435-b may be coupled with a main capacitor line 437. One or each of sub-capacitor line 432 or main capacitor line 437 may be referred to as cell plate connections.

Main capacitors 435-a and 435-b may be configured to store a charge representing one or more bits. Sub-capacitor 430-a may be configured to amplify a voltage at first capacitor line 428 based on the charge stored in first main capacitor 435-a and sub-capacitor 430-b may be configured to amplify a voltage at second capacitor line 429 based on the charge stored in second main capacitor 435-b. First main capacitor 435-a and second main capacitor 435-b may be non-volatile capacitors. In some examples, first sub-capacitor 430-*a* and second sub-capacitor 430-*b* may be non-volatile capacitors. In some examples, first main capacitor 435-*a*, second main capacitor 435-*b*, first sub-capacitor 430-*a*, second sub-capacitor 430-*b*, or any combination thereof may include a ferroelectric cell array. Additional details about ferroelectric cell arrays may be described with reference to FIGS. 5A, 5B, and 5C. In some examples, sub-capacitors 430-*a* and 430-*b* may be referred to as amplifier capacitors.

Output driver stage 335-*a* may include components 440 and 445. Component 440 (e.g., a tri-state output driver) may be configured to output a voltage on second capacitor line 429 and component 445 may be configured as a dummy load on first capacitor line 428 to match component 440, or to output a voltage on a separate output line. In some examples, at least one of component 440 and component 445 may be coupled with an output line 340 as described in FIG. 3.

FIGS. 5A, 5B and 5C illustrate example views 500-*a*, 500-*b*, and 500-*c* of a ferroelectric cell array configuration that supports systems and methods for reading and writing memory management data through a non-volatile cell based register in accordance with examples as disclosed herein. Ferroelectric cell array views 500-*a*, 500-*b*, and 500-*c* may represent different perspectives of a ferroelectric cell array that is part of a main capacitor (e.g., a main capacitor 435) or a sub-capacitor (e.g., a sub-capacitor 430). For instance, ferroelectric cell array view 500-*a* may represent a 3-dimensional view of a ferroelectric cell array, ferroelectric cell array view 500-*b* may represent a top view of the ferroelectric cell array, and ferroelectric cell array view 500-*c* may represent a side view of the ferroelectric cell array.

The ferroelectric cell array may include a top plate 505 and a bottom plate 510. The top plate 505 may be coupled with a capacitor line (e.g., a capacitor line 428 or 429 as described with reference to FIG. 4). The bottom plate 510 may be coupled with a main capacitor line (e.g., a main capacitor line 437) if the capacitor including the ferroelectric cell array is a main capacitor 435. Alternatively, if the capacitor including the ferroelectric cell array is a sub-capacitor 430, the bottom plate 510 may be coupled with a sub-capacitor line (e.g., a sub-capacitor line 432). In some examples, top plate 505 and bottom plate 510 may be metal plates.

In between the top plate 505 and the bottom plate 510, the ferroelectric cell array may include a set of ferroelectric cells 515. For instance, in the present example, the ferroelectric cell array may include 15 ferroelectric cells 515, although it should be noted that a greater or fewer quantity of ferroelectric cells 515 may be included without deviating from the scope of the present disclosure. The ferroelectric cells 515 may couple the top plate 505 with the bottom plate 510.

Using multiple ferroelectric cells 515 may increase a robustness of the capacitor that includes the ferroelectric cells. For instance, as a quantity of ferroelectric cells 515 increases, the total charge that the ferroelectric cells 515 may provide may increase. In cases where a dedicated sense amplifier is coupled with the ferroelectric cells 515 (e.g., sense amplifier 425), a latch unit including the sense amplifier, during a read operation, may exhibit increased transistor parameter deviation due to size constraints of the sense amplifier components. Accordingly, the ability of the sense amplifier to sense a bit provided by the ferroelectric cells of the latch unit during the read operation may be more likely to have an erroneous value. Using an increased total charge by increasing the number of ferroelectric cells may provide robustness against the effects of the transistor parameter deviation. Additionally, if one or some of the multiple ferroelectric cells 515 have a manufacturing defect, the remaining ferroelectric cells 515 may still be used to perform a read or write operation. Accordingly, cells that have manufacturing defects may not disrupt read or write operations. In cases where redundancy is not present (e.g., where information associated with one or more bit values stored at the ferroelectric cells 515 is not stored in another latch unit operated to store a redundant information of the one or more bit values), the increased robustness provided by the multiple ferroelectric cells 515 may enable more consistent and/or more reliable chip operation.

Figure 6:
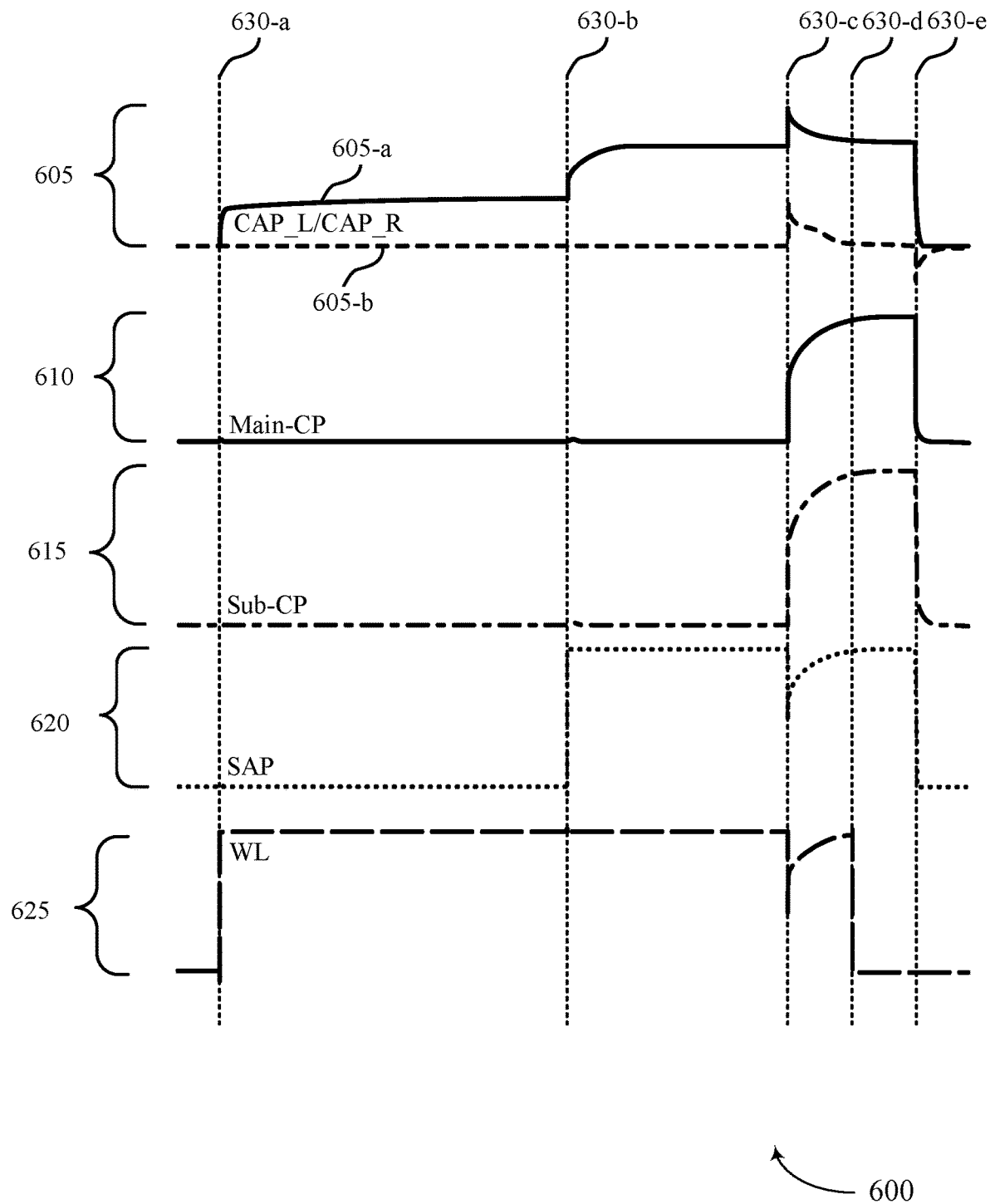
FIG. 6 illustrates an example of a write sequence that supports systems and methods for reading and writing memory management data through a non-volatile cell based register in accordance with examples as disclosed herein.

FIG. 6 illustrates an example of a write sequence 600 that supports systems and methods for reading and writing memory management data through a non-volatile cell based register in accordance with examples as disclosed herein. Write sequence 600 may depict signaling that occurs when latch unit circuit 400 is to store a first bit value or a second bit value (e.g., according to the write process described in FIG. 2). In some examples, FIG. 6 may depict performing a first phase of a write process of multiple phases, where performing each phase may write bit values to a respective row of a latch unit array (e.g., a latch unit array 300).

FIG. 6 depicts capacitor line signaling 605, main capacitor line signaling 610, sub-capacitor line signaling 615, sense amplifier activation signaling 620, and word line signaling 625. Capacitor line signaling 605 may represent signaling (e.g., voltage signaling) that occurs on capacitor line 428 and/or capacitor line 429 as described in FIG. 4. For instance, capacitor line signaling 605-*a* may represent the signaling on one of capacitor lines 428 and 429 and capacitor line signaling 605-*b* may represent the signaling on the other of capacitor lines 428 and 429.

Main capacitor line signaling 610 may represent signaling (e.g., voltage signaling) that occurs on main capacitor line 437 as described in FIG. 4 and sub-capacitor line signaling 615 may represent signaling (e.g., voltage signaling) that occurs on sub-capacitor line 432 as described in FIG. 4. When main capacitor line signaling 610 has a low value, main capacitors 435-*a* and/or 435-*b* may be deactivated, and when main capacitor line signaling 610 has a high value, main capacitors 435-*a* and/or 435-*b* may be activated. When sub-capacitor line signaling 615 has a low value, sub-capacitors 430-*a* and/or 430-*b* may be deactivated, and when sub-capacitor line signaling 615 has a high value, sub-capacitors 430-*a* and/or 430-*b* may be activated.

Sense amplifier activation signaling 620 may represent signaling that occurs on sense amplifier activation line 427 as described in FIG. 4. When sense amplifier activation signaling 620 has a low value, sense amplifier 425 may be deactivated and transistor 423 may isolate an electrical ground from the sense amplifier 425. When sense amplifier activation signaling 620 has a high value, sense amplifier 425 may be activated and transistor 423 may couple the electrical ground with sense amplifier 425. Word line signaling 625 may represent signaling that occurs on word line 402 as described with reference to FIG. 4. When word line signaling 625 has a low value, word line 402 may be deactivated. Accordingly, transistor 405 may isolate digit line 407 from sense amplifier 425 and transistor 410 may isolate digit line 412 from sense amplifier 425. When word line signaling 625 has a high value, word line 402 may be activated. Accordingly, transistor 405 may couple digit line 407 with sense amplifier 425 and transistor 410 may couple digit line 412 with sense amplifier 425.

Initially, main capacitor line signaling 610, sub-capacitor line signaling 615, sense amplifier activation signaling 620, and word line signaling 625 may have low values. Accordingly, main capacitors 435-*a* and/or 435-*b*, sub-capacitors 430-*a* and 430-*b*, sense amplifier 425, and word line 402, respectively, may be deactivated. At time 630-*a*, word line signaling 625 may transition from a low value to a high value. Accordingly, word line 402 may be activated. In such cases, capacitor line signaling 605-*a* may rise and capacitor line signaling 605-*b* may rise to a lesser amount than capacitor line signaling 605-*a*.

At time 630-*b*, sense amplifier activation signaling 620 may transition from a low value to a high value. Accordingly, sense amplifier 425 may be activated. In such cases, capacitor line signaling 605-*a* may rise and capacitor line signaling 605-*b* may rise by a lesser amount than capacitor line signaling 605-*a* or may maintain a voltage value of capacitor line signaling 605-*b* prior to 630-*b*. The rise of capacitor line signaling 605-*a* may occur such that a gap between capacitor line signaling 605-*a* and 605-*b* at time 630-*b* is greater than a gap between capacitor line signaling 605-*a* and 605-*b* at or before time 630-*a*. For instance, back-to-back inverters of the sense amplifier 425, before the sense amplifier 425 is activated at 630-*b*, may initially be in a zero-power state. However, when the sense amplifier 425 is activated at or after 630-*b*, the sense amplifier 425 may flip one way or another due to a difference between capacitor line signaling 605-*a* and 605-*b*. Accordingly, the inverters of the sense amplifier 425 may latch the digital result of the flipping. Latching the digital result in this manner may provide (e.g., via one or more transistors of sense amplifier 425) a stable, active (e.g., low impedance) drive for capacitor lines 428 and 429 during a write operation that occurs when sub-capacitor line 432 and/or main capacitor line 437 are activated (e.g., between time 630-*c* and time 630-*e*).

At time 630-*c*, one or each of main capacitor line signaling 610 and sub-capacitor line signaling 615 may transition from a low value to a high value. Accordingly, the corresponding main capacitors 435, the corresponding sub-capacitors 430, or both may be activated. In some cases, the main capacitors 435 and the sub-capacitors 430 may be activated substantially simultaneously. At or after time 630-*c*, capacitor line signaling 605-*a* and 605-*b* may initially rise and then decrease from time 630-*c* to time 630-*d*. Additionally, at or after time 630-*c*, the sense amplifier activation signaling 620 and/or the word line signaling 625 may initially fall and then increase from time 630-*c* to time 630-*d*.

At time 630-*d*, word line signaling 625 may transition from the high value to the low value. Accordingly, word line 402 may be deactivated. At time 630-*e*, main capacitor line signaling 610, sub-capacitor line signaling 615, sense amplifier activation signaling 620, or some combination thereof may transition from the respective high value to the respective low value. Accordingly, the corresponding main capacitors 435, the corresponding sub-capacitors 430, the sense amplifier 425, or any respective combination thereof may be deactivated. In such cases, capacitor line signaling 605-*a* may decrease and capacitor line signaling 605-*b* may initially decrease and may rise thereafter. Capacitor line signaling 605-*a* and 605-*b* may return to an initial value (e.g., respective values of capacitor line signaling 605-*a* and 605-*b* prior to time 630-*a*).

Figure 7:
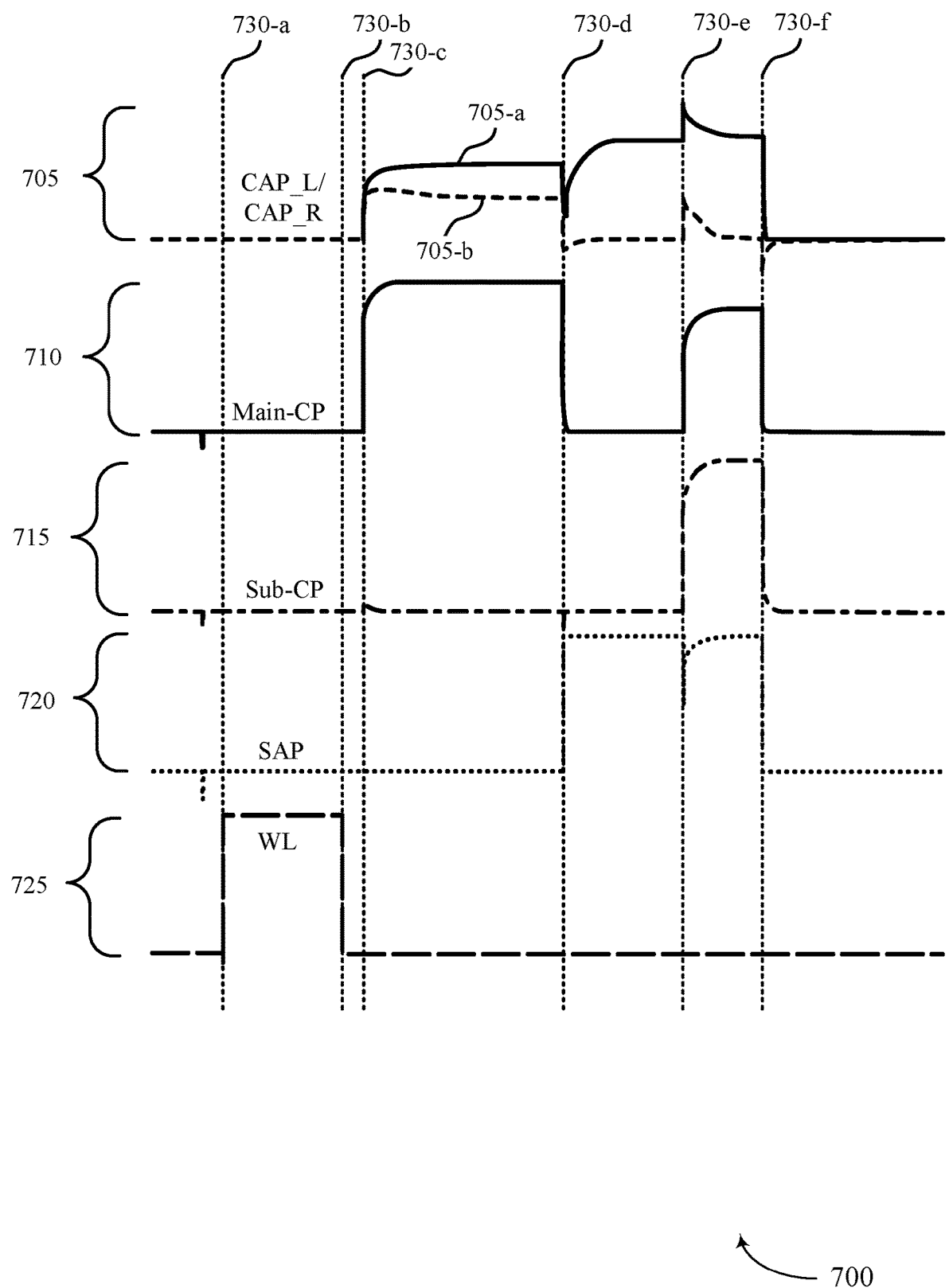
FIG. 7 illustrates an example of a read sequence that supports systems and methods for reading and writing memory management data through a non-volatile cell based register in accordance with examples as disclosed herein.

FIG. 7 illustrates an example of a read sequence 700 that supports systems and methods for reading and writing memory management data through a non-volatile cell based register in accordance with examples as disclosed herein. Read sequence 700 may depict signaling that occurs when latch unit circuit 400 is to read out a first bit value or a second bit value (e.g., according to the read process described in FIG. 2). In some examples, FIG. 7 may depict performing a first phase of a read process of multiple phases where performing each phase may read bit values from a respective row of a latch unit array (e.g., a latch unit array 300).

FIG. 7 depicts capacitor line signaling 705, main capacitor line signaling 710, sub-capacitor line signaling 715, sense amplifier activation signaling 720, and word line signaling 725. Capacitor line signaling 705 may represent signaling (e.g., voltage signaling) that occurs on capacitor line 428 and/or capacitor line 429 as described in FIG. 4. For instance, capacitor line signaling 705-*a* may represent the signaling on one of capacitor lines 428 and 429 and capacitor line signaling 705-*b* may represent the signaling on the other of capacitor lines 428 and 429.

Main capacitor line signaling 710 may represent signaling (e.g., voltage signaling) that occurs on main capacitor line 437 as described in FIG. 4 and sub-capacitor line signaling 715 may represent signaling (e.g., voltage signaling) that occurs on sub-capacitor line 432 as described in FIG. 4. When main capacitor line signaling 710 has a low value, main capacitors 435-*a* and/or 435-*b* may be deactivated, and when main capacitor line signaling 710 has a high value, main capacitors 435-*a* and/or 435-*b* may be activated. When sub-capacitor line signaling 715 has a low value, sub-capacitors 430-*a* and/or 430-*b* may be deactivated, and when sub-capacitor line signaling 715 has a high value, sub-capacitors 430-*a* and/or 430-*b* may be activated.

Sense amplifier activation signaling 720 may represent signaling that occurs on sense amplifier activation line 427 as described in FIG. 2. When sense amplifier activation signaling 720 has a low value, sense amplifier 425 may be deactivated and transistor 423 may isolate an electrical ground from the sense amplifier 425. When sense amplifier activation signaling 720 has a high value, sense amplifier 425 may be activated and transistor 423 may couple the electrical ground with sense amplifier 425. Word line signaling 725 may represent signaling that occurs on word line 402 as described with reference to FIG. 4. When word line signaling 725 has a low value, word line 402 may be deactivated. Accordingly, transistor 405 may isolate digit line 407 from sense amplifier 425 and transistor 410 may isolate digit line 412 from sense amplifier 425. When word line signaling 725 has a high value, word line 402 may be activated. Accordingly, transistor 405 may couple digit line 407 with sense amplifier 425 and transistor 410 may couple digit line 412 with sense amplifier 425.

Initially, main capacitor line signaling 710, sub-capacitor line signaling 715, sense amplifier activation signaling 720, and word line signaling 725 may have low values. Accordingly, main capacitors 435-*a* and/or 435-*b*, sub-capacitors 430-*a* and 430-*b*, sense amplifier 425, and word line 402, respectively, may be deactivated. At time 730-*a*, word line signaling 725 may transition from a low value to a high value. Accordingly, word line 402 may be activated. At time 730-*b*, word line signaling 725 may transition from the high value to the low value. Accordingly, word line 402 may be deactivated. When word line signaling 725 transitions from the high value to the low value, capacitor line signaling 705-*a* and 705-*b* may be zeroed out (e.g., may be at or may transition to a value of a determined state such as electrical ground). In some examples, capacitor line signaling 705 may be zeroed out due to transistors 415 and/or 420 being activated.

At time 730-*c*, main capacitor line signaling 710 may transition from a low value to a high value. In such cases, capacitor line signaling 705-*a* may rise and capacitor line signaling 705-*b* may rise to a lesser amount than capacitor line signaling 705-*b*. Capacitor line signaling 705-*a* and 705-*b* rising may build voltage or charge on the corresponding sub-capacitors 430. For instance, if capacitor line signaling 705-*a* corresponds to signaling on capacitor line 428 and capacitor line signaling 705-*b* corresponds to signaling on capacitor line 429, capacitor line signaling 705-*a* may build voltage or charge on sub-capacitor 430-*a* and capacitor line signaling 705-*b* rising may build voltage or charge on sub-capacitor 430-*b*. In some aspects, time 730-*b* and 730-*c* may represent a same time.

At time 730-*d*, main capacitor line signaling 710 may transition from the high value to the low value. Accordingly, main capacitors 435-*a* and/or 435-*b* may be deactivated. Additionally, at time 730-*d*, sense amplifier activation signaling 720 may transition from a low value to a high value. Accordingly, sense amplifier 425 may be activated. For instance, back-to-back inverters of the sense amplifier 425, before the sense amplifier 425 is activated at time 730-*d*, may initially be in a zero-power state. However, when the sense amplifier 425 is activated at or after time 730-*d*, the sense amplifier 425 may flip one way or another due to a difference between capacitor line signaling 705-*a* and 705-*b*. Accordingly, the inverters of the sense amplifier 425 may latch the digital result of the flipping. Latching the digital result in this manner may provide (e.g., via one or more transistors of the sense amplifier 425) a stable, active (e.g., low impedance) drive for capacitor lines 428 and 429.

At time 730-*e*, one or each of main capacitor line signaling 710 and sub-capacitor line signaling 715 may transition from a low value to a high value. Transitioning main capacitor line signaling 710 and/or sub-capacitor line signaling 715 from respective low values to respective high values may establish a voltage differential between one or each of main capacitor line 437 and sub-capacitor line 432 and a respective capacitor line (e.g., capacitor lines, 428, 429, or both). By establishing the voltage differential in this manner, the charge at the main capacitors 435 and/or sub-capacitors 430 may be refreshed to a level that the main capacitors 435 and/or the sub-capacitors 430 stored prior to or at time 730-*a*. At or after time 730-*e*, the capacitor line signaling 705 may initially rise and then decrease from time 730-*e* to time 730-*f*. Additionally, at or after time 730-*e*, the sense amplifier activation signaling 720 may initially fall and then increase from time 730-*e* to time 730-*f*.

At time 730-*f*, main capacitor line signaling 710, sub-capacitor line signaling 715, sense amplifier activation signaling 720, or some combination thereof may transition from the respective high value to the respective low value. Accordingly, the corresponding main capacitors 435, the corresponding sub-capacitors 430, the sense amplifier 425, or any respective combination thereof may be deactivated. Capacitor line signaling 705-*a*, at or after 730-*f*, may decrease and capacitor line signaling 705-*b*, at or after 730-*f*, may initially decrease and may rise thereafter. Capacitor line signaling 705-*a* and 705-*b* may return to an initial value (e.g., respective values of capacitor line signaling 705-*a* and 705-*b* prior to 730-*a*).

Figure 8:
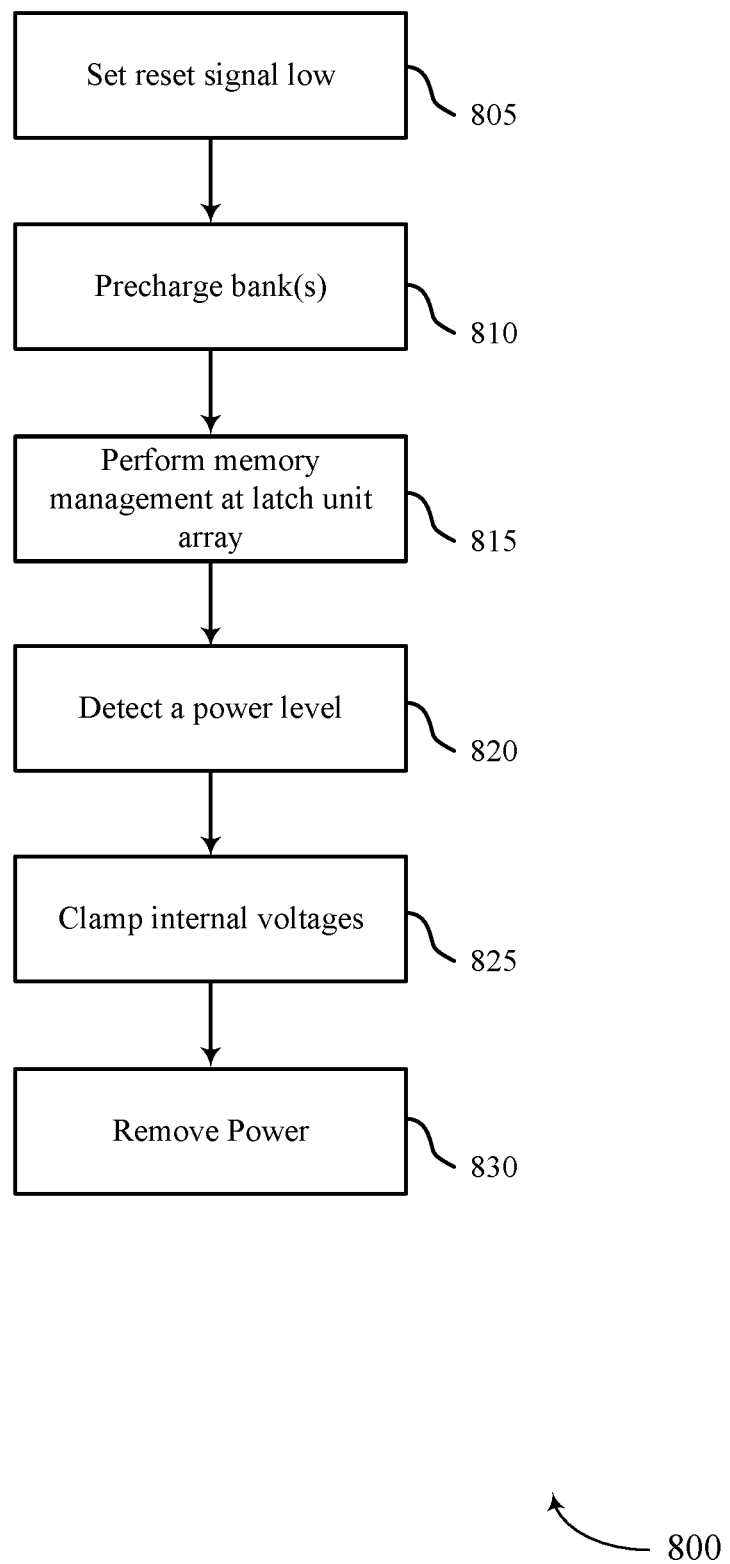
FIG. 8 illustrates an example of a power-off sequence that supports systems and methods for reading and writing memory management data through a non-volatile cell based register in accordance with examples as disclosed herein.

FIG. 8 illustrates an example of a power-down sequence 800 that supports systems and methods for reading and writing memory management data through a non-volatile cell based register in accordance with examples as disclosed herein. Power-down sequence 800 may represent a sequence that a memory device (e.g., a memory device 110) performs after determining to power down.

At 805, a host device (e.g., a host device 105) may set a reset signal of the memory device low. Setting the reset signal low may indicate a reset condition for a memory array of the memory device.

At 810, the memory device may precharge one or more banks (e.g., each bank) of the memory device. In some examples, at 810, the memory device may perform command lockout (e.g., may refrain from performing received commands at or after 810). In some examples, at 810, the memory device may exit from a power down (PDN) state.

At 815, the memory device may perform memory management at a latch unit array (e.g., a latch unit array 290 as described in FIG. 2 or a latch unit array 300 as described in FIG. 3). For instance, the memory device may write device setting values stored at registers of the memory device (e.g., at a controller of the memory device) to the latch unit array. Additional details about performing the write process may be described elsewhere herein, for example, with reference to FIGS. 2 and 6. In some examples, the memory device may perform the memory management based on setting the reset signal low (e.g., at 805) and/or precharging the banks (e.g., at 810).

At 820, the memory device may detect a power level of the memory device. For instance, the memory device may determine that a power level of the memory device is below a power level threshold. At 825, the memory device may clamp internal voltages of the memory device. Clamping the internal voltages may inhibit or prevent activation of one or more power supplies of the memory device (e.g., may prevent or inhibit from being activated charge pumps or other components that generate voltages based on external voltages). At 830, the memory device may remove power from one or more circuits or components of the memory device. For instance, the memory device may remove power from the latch unit array, one or more memory banks of the memory device, the power supplies used to power the latch unit array and/or the one or more memory banks, or any combination thereof.

Figure 9:
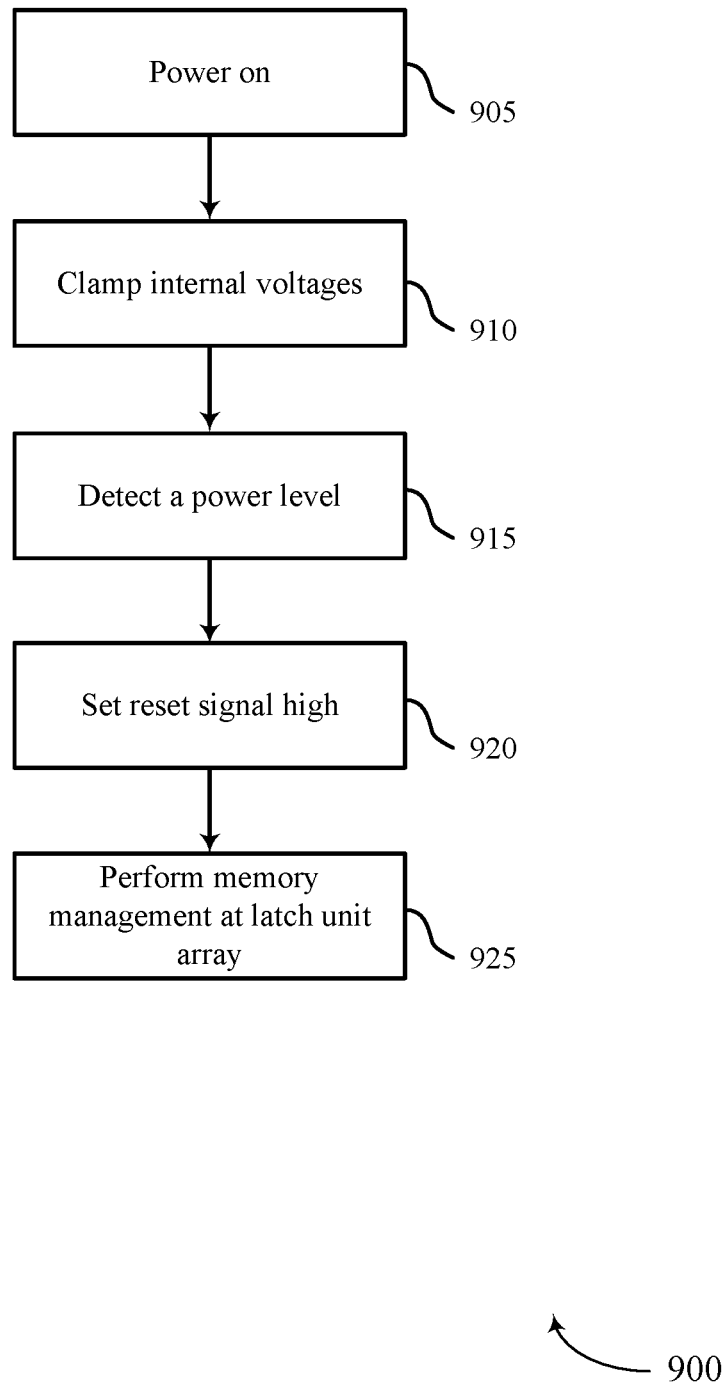
FIG. 9 illustrates an example of a power-on sequence that supports systems and methods for reading and writing memory management data through a non-volatile cell based register in accordance with examples as disclosed herein.

FIG. 9 illustrates an example of a power-up sequence 900 that supports systems and methods for reading and writing memory management data through a non-volatile cell based register in accordance with examples as disclosed herein. Power-up sequence 900 may represent a sequence that a memory device (e.g., a memory device 110) performs to power up (i.e., a power-up procedure).

At 905, the memory device may be powered on (e.g., power may be applied by a host device or external power supply). At 910, the memory device may clamp internal voltages. Clamping the internal voltages may inhibit or prevent activation of one or more power supplies of the memory device (e.g., may prevent or inhibit from being activated charge pumps or other components that generate voltages based on external voltages). At 915, the memory device may detect a power level of the memory device. For instance, the memory device may determine that a power level of the memory device is above a power level threshold.

At 920, a host device (e.g., a host device 105) may set a reset signal of the memory device high. Setting the reset signal high may indicate a normal operating condition for a memory array of the memory device.

At 925, the memory device may perform memory management at a latch unit array (e.g., a latch unit array 290 as described in FIG. 2 or a latch unit array 300 as described in FIG. 3). For instance, the memory device may read device setting values from the latch unit array and may store the values at registers of the memory device (e.g., at a controller of the memory device). Additional details about performing the read process may be described elsewhere herein, for example, with reference to FIGS. 2 and 7. In some examples, the memory device may perform the memory management based on setting the reset signal high (e.g., at 920).

Figure 10:
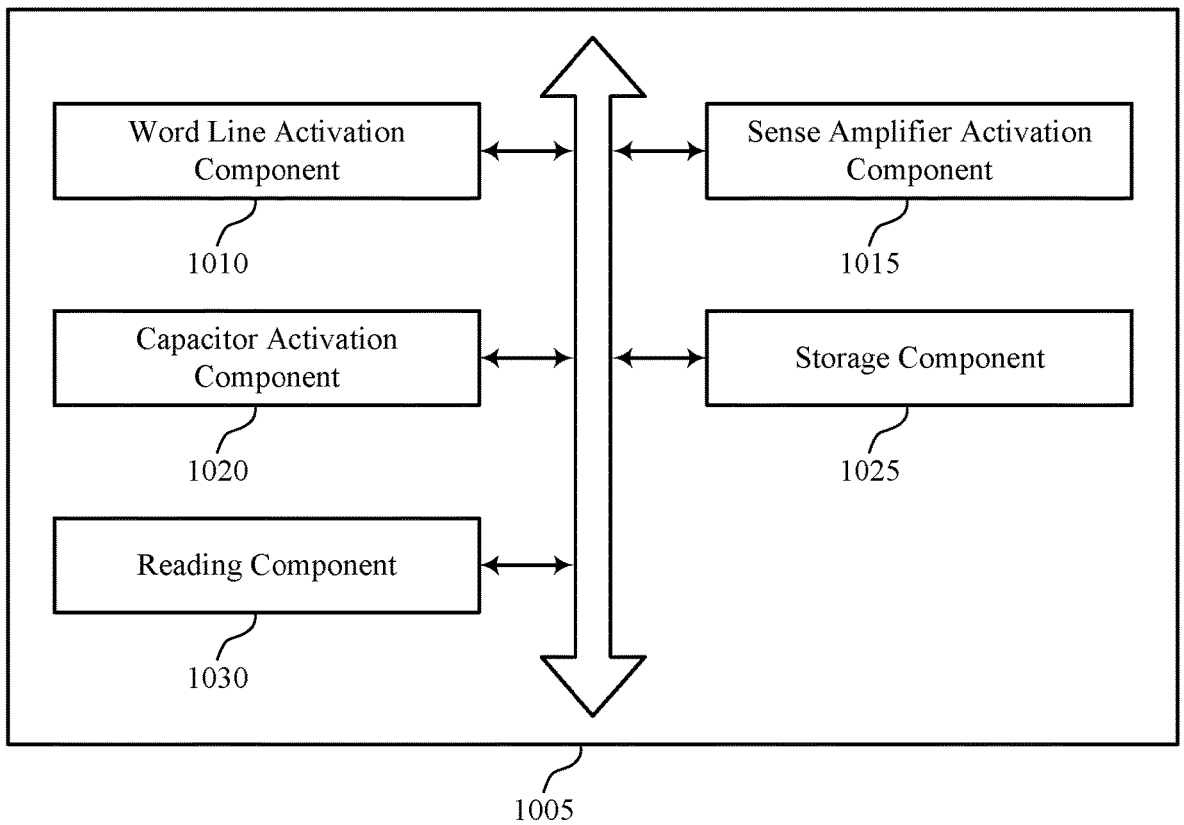
FIG. 10 shows a block diagram of a memory device that supports systems and methods for reading and writing memory management data through a non-volatile cell based register in accordance with examples as disclosed herein.

FIG. 10 shows a block diagram 1000 of a memory device 1005 that supports systems and methods for reading and writing memory management data through a non-volatile cell based register in accordance with examples as disclosed herein. The memory device 1005 may be an example of aspects of a memory device as described with reference to FIGS. 1 through 9. The memory device 1005 may include a word line activation component 1010, a sense amplifier activation component 1015, a capacitor activation component 1020, a storage component 1025, and a reading component 1030. Each of these modules may communicate, directly or indirectly, with one another (e.g., via one or more buses).

The word line activation component 1010 may activate a word line coupled with a latch unit of a set of latch units, where the set of latch units are addressable via a set of row lines and a set of column lines. In some examples, the word line activation component 1010 may deactivate the word line at a time when a first line coupled with a first non-volatile capacitor of the latch unit and a second line coupled with a second capacitor of the latch unit are activated. In some examples, the word line activation component 1010 may activate a word line coupled with a latch unit of a set of latch units, where the set of latch units are addressable via a set of row lines and a set of column lines.

The sense amplifier activation component 1015 may activate a sense amplifier of the latch unit after activating the word line. In some examples, the sense amplifier activation component 1015 may activate a sense amplifier of the latch unit after activating a first line coupled with a first non-volatile capacitor of the latch unit, where the sense amplifier is coupled with the first capacitor.

The capacitor activation component 1020 may activate, after activating the sense amplifier of the latch unit, a first line coupled with a first non-volatile capacitor of the latch unit and a second line coupled with a second capacitor of the latch unit, where the first capacitor and the second capacitor are coupled with each other and with the sense amplifier. In some examples, the capacitor activation component 1020 may activate a first line coupled with a first non-volatile capacitor of the latch unit after activating the word line. In some examples, the capacitor activation component 1020 may activate a second line coupled with a second capacitor of the latch unit after activating the sense amplifier, where the second capacitor is coupled with the sense amplifier and the first capacitor. In some examples, the capacitor activation component 1020 may deactivate the first line before activating the second line, where reading the one or more bits from the first capacitor is based on deactivating the first line before activating the second line. In some examples, the capacitor activation component 1020 may reactivate the first line after activating the sense amplifier, where reading the one or more bits from the first capacitor is based on reactivating the first line after activating the sense amplifier. In some cases, the first line is reactivated and the second line is activated substantially simultaneously.

The storage component 1025 may store one or more bits at the first capacitor based on activating the word line, the sense amplifier, the first line, and the second line. In some examples, the first line may be coupled with a third non-volatile capacitor and the third capacitor may be coupled with the sense amplifier. In such cases, the storage component 1025 may store one or more additional bits at the third capacitor based on activating the word line, the sense amplifier, and the first line. In some examples, a quantity of the one or more bits is equal to a quantity of the one or more additional bits, where the one or more bits may have a same value as the one or more additional bits. In some examples, the second line may be coupled with a fourth capacitor, where the fourth capacitor is coupled with the sense amplifier, and where storing the one or more additional bits at the third capacitor is based on the third capacitor and the fourth capacitor being coupled with each other.

The reading component 1030 may read one or more bits from the first capacitor based on activating the word line, the first line, the sense amplifier, and the second line. In some examples, the first line may be coupled with a third, non-volatile capacitor, where the third capacitor is coupled with the sense amplifier. In such examples, the reading component 1030 may read one or more additional bits from the third capacitor based on activating the word line, the first line, and the sense amplifier. In some cases, a quantity of the one or more bits is equal to a quantity of the one or more additional bits, where the one or more bits have a same value as the one or more additional bits. In some cases, the second line is coupled with a fourth capacitor, where the fourth capacitor is coupled with the sense amplifier, and where reading the one or more additional bits from the third capacitor is based on the third capacitor and the fourth capacitor being coupled with each other.

Figure 11:
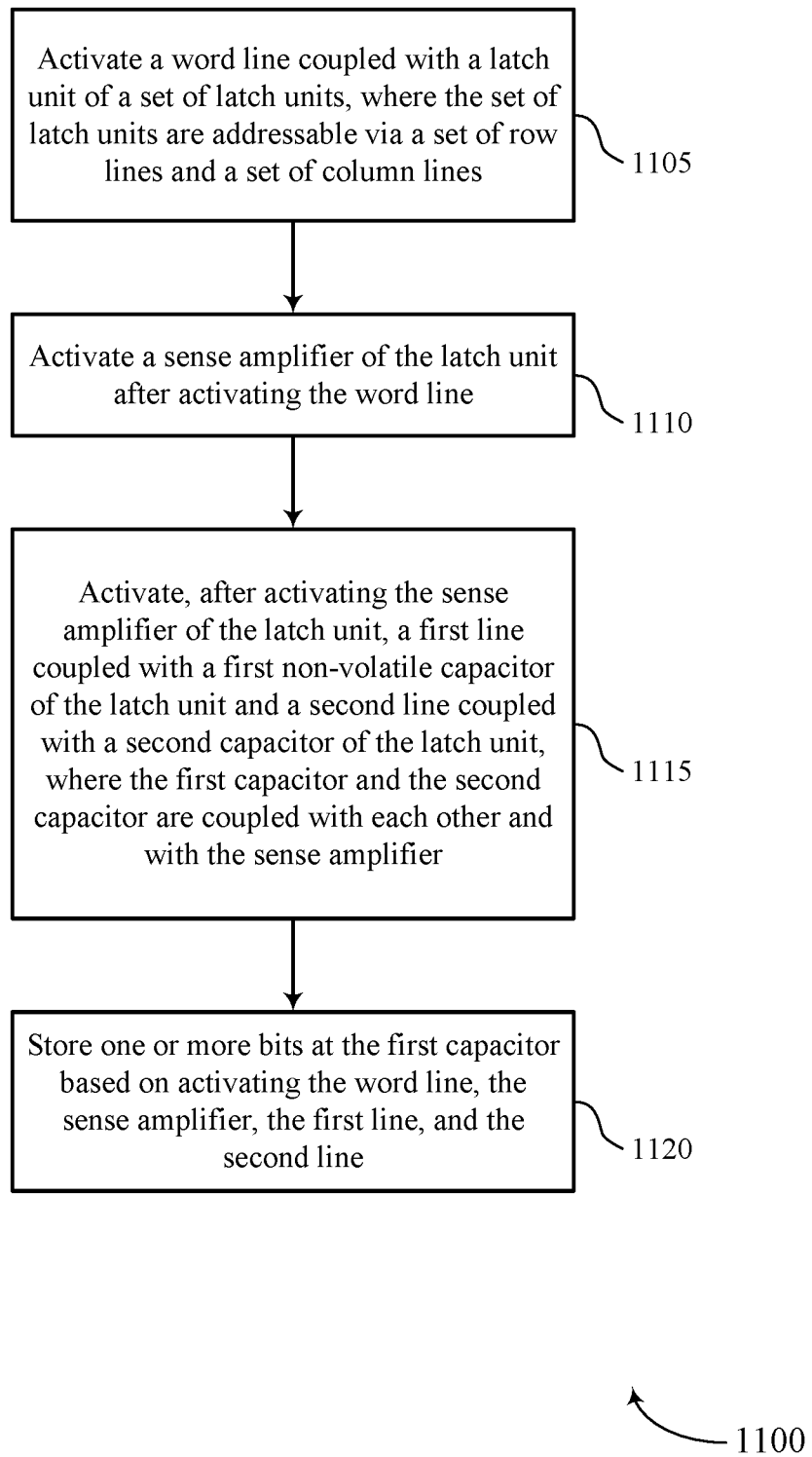
FIGS. 11 and 12 show flowcharts illustrating a method or methods that support systems and methods for reading and writing memory management data through a non-volatile cell based register in accordance with examples as disclosed herein.

FIG. 11 shows a flowchart illustrating a method or methods 1100 that supports systems and methods for reading and writing memory management data through a non-volatile cell based register in accordance with examples as disclosed herein. The operations of method 1100 may be implemented by a memory device or its components as described herein. For example, the operations of method 1100 may be performed by a memory device as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1105, the memory device may activate a word line coupled with a latch unit of a set of latch units, where the set of latch units are addressable via a set of row lines and a set of column lines. The operations of 1105 may be performed according to the methods described herein. In some examples, aspects of the operations of 1105 may be performed by a word line activation component as described with reference to FIG. 10.

At 1110, the memory device may activate a sense amplifier of the latch unit after activating the word line. The operations of 1110 may be performed according to the methods described herein. In some examples, aspects of the operations of 1110 may be performed by a sense amplifier activation component as described with reference to FIG. 10.

At 1115, the memory device may activate, after activating the sense amplifier of the latch unit, a first line coupled with a first non-volatile capacitor of the latch unit and a second line coupled with a second capacitor of the latch unit, where the first capacitor and the second capacitor are coupled with each other and with the sense amplifier. The operations of 1115 may be performed according to the methods described herein. In some examples, aspects of the operations of 1115 may be performed by a capacitor activation component as described with reference to FIG. 10.

At 1120, the memory device may store one or more bits at the first capacitor based on activating the word line, the sense amplifier, the first line, and the second line. The operations of 1120 may be performed according to the methods described herein. In some examples, aspects of the operations of 1120 may be performed by a storage component as described with reference to FIG. 10.

In some examples, an apparatus as described herein may perform a method or methods, such as the method 1100. The apparatus may include features, means, or instructions (e.g., a non-transitory computer-readable medium storing instructions executable by a processor) for activating a word line coupled with a latch unit of a set of latch units, where the set of latch units are addressable via a set of row lines and a set of column lines; activating a sense amplifier of the latch unit after activating the word line; activating, after activating the sense amplifier of the latch unit, a first line coupled with a first non-volatile capacitor of the latch unit and a second line coupled with a second capacitor of the latch unit, where the first capacitor and the second capacitor are coupled with each other and with the sense amplifier; and storing one or more bits at the first capacitor based on activating the word line, the sense amplifier, the first line, and the second line.

In some examples of the method 1100 and the apparatus described herein, the first line may be coupled with a third non-volatile capacitor, where the third capacitor is coupled with the sense amplifier, and the method 1100 and the apparatus described herein may further include operations, features, means, or instructions for storing one or more additional bits at the third capacitor based on activating the word line, the sense amplifier, and the first line.

In some examples of the method 1100 and the apparatus described herein, a quantity of the one or more bits may be equal to a quantity of the one or more additional bits, where the one or more bits may have a same value as the one or more additional bits.

In some examples of the method 1100 and the apparatus described herein, the second line may be coupled with a fourth capacitor, where the fourth capacitor may be coupled with the sense amplifier, and where storing the one or more additional bits at the third capacitor may be based on the third capacitor and the fourth capacitor being coupled with each other.

Some examples of the method 1100 and the apparatus described herein may further include operations, features, means, or instructions for deactivating the word line at a time when the first line and the second line may be activated.

Figure 12:
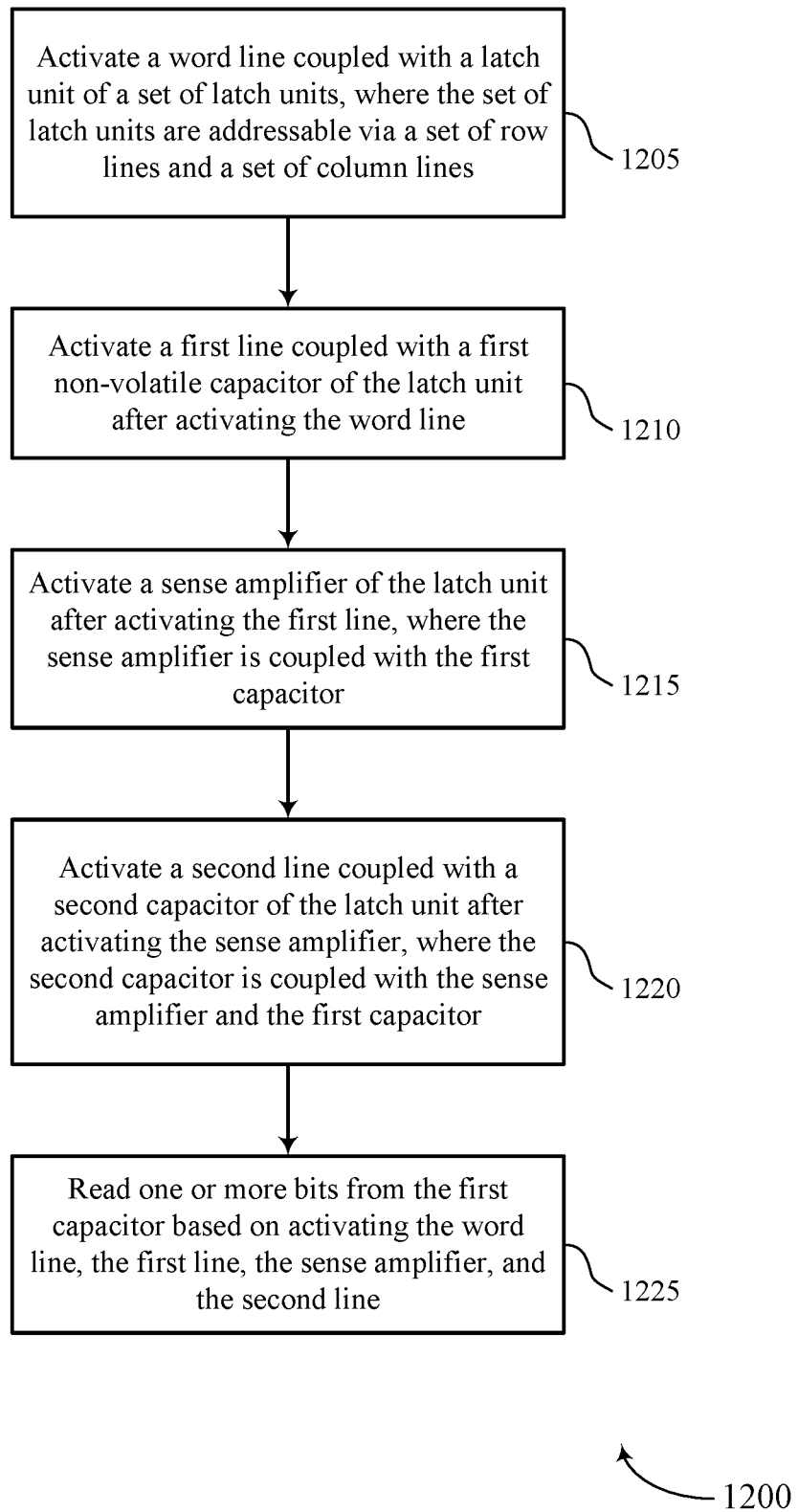

FIG. 12 shows a flowchart illustrating a method or methods 1200 that supports systems and methods for reading and writing memory management data through a non-volatile cell based register in accordance with examples as disclosed herein. The operations of method 1200 may be implemented by a memory device or its components as described herein. For example, the operations of method 1200 may be performed by a memory device as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1205, the memory device may activate a word line coupled with a latch unit of a set of latch units, where the set of latch units are addressable via a set of row lines and a set of column lines. The operations of 1205 may be performed according to the methods described herein. In some examples, aspects of the operations of 1205 may be performed by a word line activation component as described with reference to FIG. 10.

At 1210, the memory device may activate a first line coupled with a first non-volatile capacitor of the latch unit after activating the word line. The operations of 1210 may be performed according to the methods described herein. In some examples, aspects of the operations of 1210 may be performed by a capacitor activation component as described with reference to FIG. 10.

At 1215, the memory device may activate a sense amplifier of the latch unit after activating the first line, where the sense amplifier is coupled with the first capacitor. The operations of 1215 may be performed according to the methods described herein. In some examples, aspects of the operations of 1215 may be performed by a sense amplifier activation component as described with reference to FIG. 10.

At 1220, the memory device may activate a second line coupled with a second capacitor of the latch unit after activating the sense amplifier, where the second capacitor is coupled with the sense amplifier and the first capacitor. The operations of 1220 may be performed according to the methods described herein. In some examples, aspects of the operations of 1220 may be performed by a capacitor activation component as described with reference to FIG. 10.

At 1225, the memory device may read one or more bits from the first capacitor based on activating the word line, the first line, the sense amplifier, and the second line. The operations of 1225 may be performed according to the methods described herein. In some examples, aspects of the operations of 1225 may be performed by a reading component as described with reference to FIG. 10.

In some examples, an apparatus as described herein may perform a method or methods, such as the method 1200. The apparatus may include features, means, or instructions (e.g., a non-transitory computer-readable medium storing instructions executable by a processor) for activating a word line coupled with a latch unit of a set of latch units, where the set of latch units are addressable via a set of row lines and a set of column lines; activating a first line coupled with a first non-volatile capacitor of the latch unit after activating the word line; activating a sense amplifier of the latch unit after activating the first line, where the sense amplifier is coupled with the first capacitor; activating a second line coupled with a second capacitor of the latch unit after activating the sense amplifier, where the second capacitor is coupled with the sense amplifier and the first capacitor, and reading one or more bits from the first capacitor based on activating the word line, the first line, the sense amplifier, and the second line.

In some examples of the method 1200 and the apparatus described herein, the first line may be coupled with a third non-volatile capacitor, where the third capacitor is coupled with the sense amplifier, and where the method 1200 and the apparatus described herein may further include operations, features, means, or instructions for reading one or more additional bits from the third capacitor based on activating the word line, the first line, and the sense amplifier.

In some examples of the method 1200 and the apparatus described herein, a quantity of the one or more bits may be equal to a quantity of the one or more additional bits, where the one or more bits may have a same value as the one or more additional bits.

In some examples of the method 1200 and the apparatus described herein, the second line may be coupled with a fourth capacitor, where the fourth capacitor may be coupled with the sense amplifier, and where reading the one or more additional bits from the third capacitor may be based on the third capacitor and the fourth capacitor being coupled with each other.

Some examples of the method 1200 and the apparatus described herein may further include operations, features, means, or instructions for deactivating the first line before activating the second line, where reading the one or more bits from the first capacitor may be based on deactivating the first line before activating the second line.

Some examples of the method 1200 and the apparatus described herein may further include operations, features, means, or instructions for reactivating the first line after activating the sense amplifier, where reading the one or more bits from the first capacitor may be based on reactivating the first line after activating the sense amplifier.

In some examples of the method 1200 and the apparatus described herein, the first line may be reactivated and the second line may be activated substantially simultaneously.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a set of latch units addressable via a set of row lines and a set of column lines, each latch unit including a sense amplifier coupled with a first line; a first non-volatile capacitor coupled with the first line and a second line, where the first capacitor is configured to store a charge representing one or more bits; and a second capacitor coupled with the first line and a third line, where the second capacitor is configured to amplify a voltage at the first line based on the charge stored in the first capacitor.

In some examples, each latch unit further may include a third non-volatile capacitor coupled with a fourth line and the second line, where the third capacitor may be configured to store a charge representing one or more additional bits, and where the fourth line may be coupled with the sense amplifier; and a fourth capacitor coupled with the fourth line and the third line, where the fourth capacitor may be configured to amplify a voltage at the fourth line based on the charge stored at the third capacitor.

In some examples, a quantity of the one or more bits may be equal to a quantity of the one or more additional bits, and where the one or more bits may have a same value as the one or more additional bits.

In some examples, the third capacitor includes a set of non-volatile capacitors coupled with the fourth line and the second line, where the set of non-volatile capacitors may be configured to store the charge representing the one or more additional bits.

In some examples, the fourth capacitor includes a set of capacitors coupled with the fourth line and the third line, where the set of capacitors may be configured to amplify the voltage at the fourth line based on the charge stored at the set of non-volatile capacitors.

In some examples, the second capacitor includes a non-volatile capacitor.

In some examples, the first capacitor includes a set of non-volatile capacitors coupled with the first line and the second line, where the set of non-volatile capacitors may be configured to store the charge representing the one or more bits.

In some examples, the second capacitor includes a set of capacitors coupled with the first line and the third line, where the set of capacitors may be configured to amplify the voltage at the first line based on the charge stored at the set of non-volatile capacitors.

An apparatus is described. The apparatus may include a set of latch units addressable via a set of row lines and a set of column lines, each latch unit including a sense amplifier coupled with a first line; a first non-volatile capacitor coupled with the first line and a second line; a second capacitor coupled with the first line and a third line, and a controller of the memory device coupled with at least one of the set of latch units, where the controller is configured to: determine that the memory device is to power down, store one or more bits at the first capacitor based on the determination that the memory device is to power down, and perform the power down after storing the one or more bits at the first capacitor.

In some examples, each latch unit further may include a third non-volatile capacitor coupled with a fourth line and the second line, where the sense amplifier may be coupled with the fourth line, and a fourth capacitor coupled with the fourth line and the third line.

In some examples, the controller may be further configured to: store one or more additional bits at the third capacitor based on the determination that the memory device is to power down, and perform the power down after storing the one or more additional bits at the third capacitor.

In some examples, a quantity of the one or more bits may be equal to a quantity of the one or more additional bits, and where the one or more bits may have a same value as the one or more additional bits.

In some examples, the controller may further be configured to: set a reset signal to a state indicating a reset condition for a memory array of the memory device based on determining that the memory device is to power down, where storing the one or more bits at the first capacitor may be based on setting the reset signal to the state.

In some examples, the controller may further be configured to: precharge one or more banks of the memory device based on determining that the memory device is to power down, where storing the one or more bits at the first capacitor may be based on precharging the one or more banks of the memory device.

In some examples, each latch unit may include a third non-volatile capacitor and a fourth capacitor, where the one or more bits are stored at the first capacitor during a first phase, and where the controller is further configured to: store one or more additional bits at the third capacitor based on the determination that the memory device may be to power down, and perform the power down after storing the one or more additional bits at the third capacitor.

In some examples, the first capacitor includes a ferroelectric capacitor.

An apparatus is described. The apparatus may include a set of latch units addressable via a set of row lines and a set of column lines, each latch unit including a sense amplifier coupled with a first line; a first non-volatile capacitor coupled with the first line and a second line; a second capacitor coupled with the first line and a third line; and a controller of the memory device coupled with at least one of the set of latch units and configured to: perform a power-up procedure at the memory device, where performing the power-up procedure involves reading the one or more bits stored at the first capacitor based on activating the sense amplifier, the second line, and the third line such that a charge stored on the first capacitor is amplified by the second capacitor for sensing by the sense amplifier.

In some examples, each latch unit further may include a third non-volatile capacitor coupled with a fourth line and the second line, where the sense amplifier may be coupled with the fourth line, and a fourth capacitor coupled with the fourth line and the third line.

In some examples, the controller may be configured to: read one or more additional bits from the third capacitor as part of performing the power-up procedure, where the fourth capacitor amplifies a charge stored by the third capacitor based on the activating the sense amplifier, the second line, and the third line for sensing by the sense amplifier.

In some examples, a quantity of the one or more bits may be equal to a quantity of the one or more additional bits, and where the one or more bits may have a same value as the one or more additional bits.

In some examples, the controller may be configured to: set a reset signal to a state indicating a normal operating condition for a memory array of the memory device as part of performing the power-up procedure, where reading the one or more bits stored at the first capacitor may be based on setting the reset signal to the state.

In some examples, each latch unit includes a third non-volatile capacitor and a fourth capacitor, where reading the one or more bits stored at the first capacitor may be based on one or more additional bits stored by the third capacitor.

In some examples, the first capacitor includes a ferroelectric capacitor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent each example that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a latch unit array comprising a plurality of latch units addressable via a plurality of row lines and a plurality of column lines, each latch unit comprising:
   a first, non-volatile, memory element coupled with a first line and a second line, the first memory element comprising:
   a first plate coupled with the first line;
   a second plate coupled with the second line; and
   a first plurality of ferroelectric capacitors coupled between the first plate and the second plate, wherein the first plurality of ferroelectric capacitors are configured to store a first charge representing one or more bits; and
   a sense component coupled with the first memory element.

2. The apparatus of claim 1, wherein each latch unit further comprises:
   a second, non-volatile, memory element coupled with the first line and a third line, the second memory element comprising:
   a first plate coupled with the first line;
   a second plate coupled with the third line; and
   a second plurality of ferroelectric capacitors coupled between the first plate and the second plate, wherein the second plurality of ferroelectric capacitors of the second memory element are configured to build a second charge at the second memory element based at least in part on the first charge stored in the first plurality of ferroelectric capacitors of the first memory element and a signal applied to the second line.

3. The apparatus of claim 2, wherein each latch unit further comprises:
   a third, non-volatile, memory element coupled with a fourth line and the second line, the third memory element comprising:
   a first plate coupled with the fourth line;
   a second plate coupled with the second line; and
   a third plurality of ferroelectric capacitors coupled between the first plate and the second plate, wherein the third plurality of ferroelectric capacitors of the third memory element are configured to store a third charge representing one or more additional bits.

4. The apparatus of claim 3, wherein each latch unit further comprises:
   a fourth, non-volatile, memory element coupled with the fourth line and the third line, the fourth memory element comprising:
   a first plate coupled with the fourth line;
   a second plate coupled with the third line; and
   a fourth plurality of ferroelectric capacitors coupled between the first plate and the second plate, wherein the fourth plurality of ferroelectric capacitors of the fourth memory element are configured to build a fourth charge at the fourth memory element based at least in part on the third charge stored at the third plurality of ferroelectric capacitors of the third memory element and the signal applied to the second line.

5. The apparatus of claim 3, wherein a quantity of the one or more bits is equal to a quantity of the one or more additional bits, and wherein the one or more bits have a same value as the one or more additional bits.

6. The apparatus of claim 2, wherein the second plurality of ferroelectric capacitors comprises one or more redundant capacitors, wherein the one or more redundant capacitors are configured to build the second charge at the second memory element based at least in part on one or more defects in one or more other capacitors of the second plurality of ferroelectric capacitors.

7. The apparatus of claim 1, wherein the first charge stored at the first plurality of ferroelectric capacitors is greater than a fifth charge stored at a fifth memory element, wherein the fifth memory element comprises a non-volatile capacitor.

8. A memory device, comprising:
   a plurality of memory cells accessible via a first plurality of row lines and a first plurality of column lines, wherein each memory cell of the plurality of memory cells comprises a ferroelectric capacitor;
   a decoder coupled with the plurality of memory cells;
   a sense component coupled with the plurality of memory cells;
   a peripheral circuit coupled with the decoder, the peripheral circuit comprising:
      a buffer coupled with the decoder;
      a counter coupled with the buffer;
      a first driver coupled with the counter;
      a second driver coupled with the first driver;
      a first controller coupled with the first driver and the second driver; and
      a latch unit array coupled with the first controller and the second driver, the latch unit array comprising a plurality of latch units addressable via a second plurality of row lines and a second plurality of column lines, wherein each latch unit of the plurality of latch units comprises a memory element comprising plurality of ferroelectric capacitors; and
   a second controller coupled with the plurality of memory cells via the decoder and the sense component, wherein the second controller is configured to access the plurality of memory cells.

9. The memory device of claim 8, wherein the second controller is further configured to perform a power down procedure for the memory device, wherein performing the power down procedure comprises:
   determining that the memory device is to power down;
   storing one or more bits at least one latch unit of the latch unit array based at least in part on the determination that the memory device is to power down; and
   performing a power down after storing the one or more bits at least one latch unit of the latch unit array.

10. The memory device of claim 9, wherein storing one or more bits at the at least one latch unit of the latch unit array comprises:
   activating, by the second driver, one or more row lines of the second plurality of row lines;
   activating, by the first controller, one or more column lines of the second plurality of column lines; and
   storing one or more bits at the at least one latch unit of the latch unit array based at least in part on activating the one or more row lines and the one or more column lines.

11. The memory device of claim 9, wherein the memory device further comprises:
   one or more registers, wherein storing the one or more bits at the at least one latch unit of the latch unit array comprises reading the one or more bits from the one or more registers, and storing the one or more bits from the one or more registers at the at least one latch unit.

12. The memory device of claim 8, wherein the second controller is further configured to perform a power-up procedure for the memory device, wherein performing the power-up procedure comprises:
   reading one or more bits stored in at least one latch unit of the latch unit array; and
   storing the one or more bits at one or more registers of the memory device based at least in part on reading the one or more bits from the at least one latch unit of the latch unit array.

13. The memory device of claim 12, wherein reading the one or more bits from the at least one latch unit of the latch unit array comprises:
   activating, by the second driver, one or more row lines of the second plurality of row lines;
   activating, by the first controller, one or more column lines of the second plurality of column lines; and
   reading the one or more bits from the at least one latch unit of the latch unit array based at least in part on activating the one or more row lines and the one or more column lines.

14. The memory device of claim 8, wherein the first controller is coupled with the latch unit array via a row driver, the first controller configured to transmit an address to the row driver based at least in part on an access operation.

15. The memory device of claim 8, wherein each latch unit of the latch unit array comprises a first memory element and a second memory element, wherein the first memory element is configured to store a first charge, and wherein the second memory element is configured to build a second charge based at least in part on the first charge stored at the first memory element.

16. An apparatus, comprising:
   a latch unit array comprising a plurality of latch units coupled with a first plurality of row lines and a first plurality of column lines, wherein each latch unit comprises a respective first memory element coupled with a first signal line and a second signal line, and a respective second memory element coupled with the first signal line and a third signal line, the respective first memory elements and second memory elements each comprising a respective plurality of ferroelectric memory cells, wherein the latch unit array is configured to:
      build, at a first time, respective second charges at the respective second memory elements based at least in part on respective first charges stored at the respective first memory elements and a first signal applied to the second signal line at the first time; and
      latch, at a second time after the first time, respective values associated with the respective second charges using one or more respective transistors of each latch unit.

17. The apparatus of claim 16, wherein each latch unit further comprises a respective third memory element coupled with a fourth signal line and the second signal line, and a respective fourth memory element coupled with the fourth signal line and the third signal line, wherein the latch unit array is configured to:
   build, at the first time, respective fourth charges at the respective fourth memory elements based at least in part on respective third charges stored at the respective third memory elements and the first signal applied to the second signal line at the first time,
   wherein latching the respective values using the one or more respective transistors is based at least in part on the respective fourth charges.

18. The apparatus of claim 17, wherein latching the respective values using the one or more respective transistors is based at least in part on a difference between the respective second charges and the respective fourth charges.

19. The apparatus of claim 17, wherein latching the respective values using the one or more respective transistors is based at least in part on activating one or more inverters of a respective sense amplifier of each latch unit, wherein the one or more inverters are activated based at least in part on a third signal applied to a fourth signal line at the second time.

20. The apparatus of claim 16, wherein the plurality of latch units is further configured to:
 refresh the respective first memory elements and the respective second memory elements based at least in part on a third signal applied to the second signal line, a fourth signal applied to the third signal line, or both.

* * * * *